United States Patent
Hou et al.

(10) Patent No.: US 9,553,199 B2
(45) Date of Patent: Jan. 24, 2017

(54) FET DEVICE HAVING A VERTICAL CHANNEL IN A 2D MATERIAL LAYER

(71) Applicants: Taiwan Semiconductor Manufacturing Company, Ltd., Hsin-Chu (TW); National Chiao Tung University, Hsinchu (TW)

(72) Inventors: Tuo-Hung Hou, Hsin-Chu (TW); Samuel C. Pan, Hsin-Chu (TW)

(73) Assignees: Taiwan Semiconductor Manufacturing Company, Ltd., Hsin-Chu (TW); National Chiao Tung University, Hsinchu (TW)

( * ) Notice: Subject to any disclaimer, the term of this patent is extended or adjusted under 35 U.S.C. 154(b) by 0 days.

(21) Appl. No.: 14/586,725

(22) Filed: Dec. 30, 2014

(65) Prior Publication Data

US 2016/0190343 A1    Jun. 30, 2016

(51) Int. Cl.
| | |
|---|---|
| *H01L 29/786* | (2006.01) |
| *H01L 29/417* | (2006.01) |
| *H01L 29/423* | (2006.01) |
| *H01L 29/10* | (2006.01) |
| *H01L 21/762* | (2006.01) |
| *H01L 21/768* | (2006.01) |
| *H01L 29/66* | (2006.01) |

(52) U.S. Cl.
CPC ..... *H01L 29/78681* (2013.01); *H01L 21/7624* (2013.01); *H01L 21/76895* (2013.01); *H01L 29/1037* (2013.01); *H01L 29/41733* (2013.01); *H01L 29/42384* (2013.01); *H01L 29/66742* (2013.01); *H01L 29/78684* (2013.01)

(58) Field of Classification Search
CPC .. H01L 27/101; H01L 29/0676; H01L 29/775; H01L 29/66439; H01L 51/057; H01L 51/0048; H01L 29/78681; H01L 29/66742; H01L 29/41733; H01L 29/78684; H01L 29/42384; H01L 29/1037; H01L 21/7624; H01L 21/76895; H01L 23/535
See application file for complete search history.

(56) References Cited

U.S. PATENT DOCUMENTS

| | | | |
|---|---|---|---|
| 6,744,111 B1 | 6/2004 | Wu | |
| 2009/0166686 A1* | 7/2009 | Hunt | B82Y 10/00 257/288 |
| 2012/0286244 A1* | 11/2012 | Chiu | H01L 29/42364 257/40 |

OTHER PUBLICATIONS

Hergenrother, J.M., et al., "The Vertical Replacement-Gate (VRG) MOSFET," Solid-State Electronics 46 (2002), pp. 939-950.
(Continued)

*Primary Examiner* — Mohammad Islam
*Assistant Examiner* — Christina Sylvia
(74) *Attorney, Agent, or Firm* — Slater Matsil, LLP

(57) ABSTRACT

Semiconductor devices and methods of forming the same are provided. A source/drain electrode stack is formed over a substrate, wherein the source/drain electrode stack comprises a first source/drain electrode and a second source/drain electrode. A source/channel/drain layer is formed on a sidewall of the source/drain electrode stack, wherein the source/channel/drain layer comprises a 2D material. A gate stack is formed on the source/channel/drain layer.

20 Claims, 16 Drawing Sheets

(56) References Cited

OTHER PUBLICATIONS

Kim, J., et al., Novel Vertical-Stacked-Array-Transistor (VSAT) for Ultra-High-Density and Cost-Effective NAND Flash Memory Devices and SSD (Solid State Drive), 2009 Symposium on VLSI Technology Digest of Technical Papers, pp. 186-187.
Lue, H-T, et al., "A Highly Scalable 8-Layer 3D Vertical-Gate (VG) TFT NAND Flash Using Junction-Free Buried Channel BE-SONOS Device," 2010 Symposium on VLSI Technology Digest of Technical Papers, pp. 131-132.
Radisavljevic, B., et al., "Single-layer MoS2 Transistors," Nature Nanotechnology, vol. 6, Mar. 2011, www.nature.com/naturenanotechnology, pp. 147-151.
Scharf, T.W., et al., "Atomic Layer Deposition of Tungsten Disulphide Solid Lubricant Nanocomposite Coatings on Rolling Element Bearings," (2009) Tribology Transactions, 52:3, pp. 284-292.
Tan, L. K., et al., "Atomic Layer Deposition of a MoS2 Film," Royal Society of Chemistry, Nanoscale, 2014, 6, pp. 10584-10588.
Sun, L., et al., "A Planar Asymmetric Schottky Barrier Source/Drain Structure for Naon-Scale MOSFETs," Semicond. Sci. Technol. 21 (2006), pp. 608-611.

\* cited by examiner

FET DEVICE HAVING A VERTICAL CHANNEL IN A 2D MATERIAL LAYER

BACKGROUND

Semiconductor devices are used in a variety of electronic applications, such as personal computers, cell phones, digital cameras, and other electronic equipment, as examples. Semiconductor devices are typically fabricated by sequentially depositing insulating or dielectric layers, conductive layers, and semiconductive layers of material over a semiconductor substrate, and patterning the various material layers using lithography to form circuit components and elements thereon.

Transistors are circuit components or elements that are often formed on semiconductor devices. Many transistors may be formed on a semiconductor device in addition to capacitors, inductors, resistors, diodes, conductive lines, or other elements, depending on the circuit design. A field effect transistor (FET) is one type of transistor.

Generally, a transistor includes a gate stack formed between source and drain regions. The source and drain regions may include a doped region of a substrate and may exhibit a doping profile suitable for a particular application. The gate stack is positioned over the channel region and may include a gate dielectric interposed between a gate electrode and the channel region in the substrate.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 1A-8A illustrate various top views of a fabrication process of a semiconductor device in accordance with some embodiments.

FIGS. 1B-8B illustrate various first cross-sectional views of a fabrication process of a semiconductor device in accordance with some embodiments.

FIGS. 1C-8C illustrate various second cross-sectional views of a fabrication process of a semiconductor device in accordance with some embodiments.

DETAILED DESCRIPTION

Figure 1A:
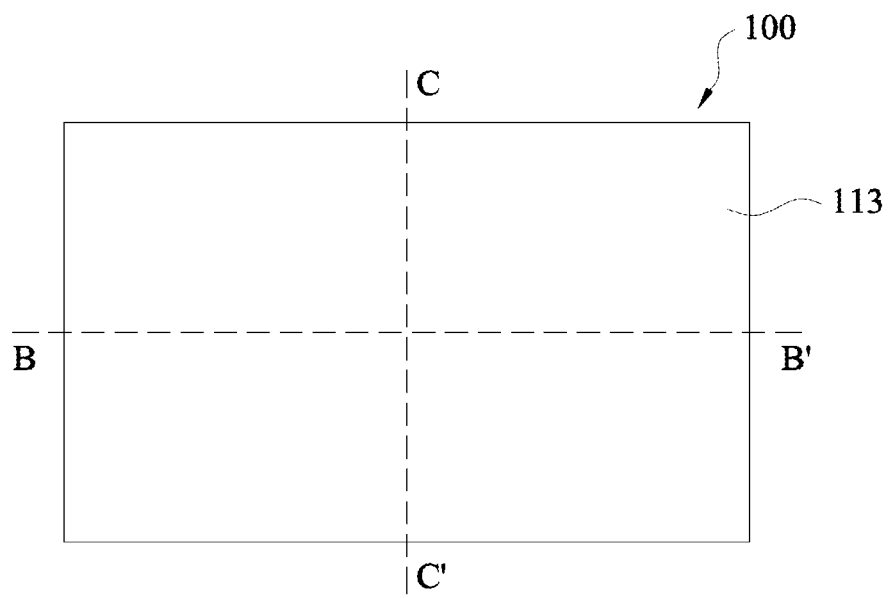

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

A field effect transistor (FET) and a method of forming the same are provided in accordance with various exemplary embodiments. The intermediate stages of forming the FET are illustrated. Variations of the embodiments are discussed. Throughout the various views and illustrative embodiments, like reference numbers are used to designate like elements.

Embodiments such as those described herein provide a FET device with one or more vertical channel regions formed in a two dimensional (2D) material layer that is formed on sidewalls of a source/drain stack. Suitable 2D materials include one to a few monolayers (such as less than about 30 monolayers) of transition metal dichalcogenides (TMDCs), graphene (monolayer of graphite), and boron nitride (BN). Generally, 2D materials are monolayers of material held together by chemical bonds. Monolayers may be stacked upon each other to form a 2D material layer comprising individual monolayers. For example, individual monolayers of graphene, TMDCs, and/or BN may be stacked to create a 2D material layer.

The use of 2D material layers allows for FET devices that provide improved gate control, since channel regions formed in 2D material layers are one to a few atomic layers thick. Moreover, the use of 2D material layers allows for FET devices without doped source/drain regions. In addition, the use of the source/gate stack allows for FET devices with channel lengths that are determined by layer thicknesses and, therefore, are not restricted by the photolithography limit.

FIGS. 1A-8C illustrate various intermediate stages of fabrication of a semiconductor device 100 in accordance with some embodiments. FIGS. 1A-8C illustrate top and cross-sectional views, wherein an "A" figure represents a top view, a "B" figure represents a first cross-sectional view along the B-B' line of the respective "A" figure, and a "C" figure represents a second cross-sectional view along the C-C' line (perpendicular to the B-B' line) of the respective "A" figure. In particular, FIGS. 1A-2C illustrate various intermediate stages of fabrication of a source/drain stack of the semiconductor device 100 in accordance with some embodiments. FIGS. 3A-5C illustrate various intermediate stages of fabrication of a source/channel/drain layer and a gate stack over the source/drain stack of the semiconductor device 100 in accordance with some embodiments. FIGS. 6A-8C illustrate various intermediate stages of fabrication of conductive plugs that provide electrical connections to the gate stack and the source/drain stack of the semiconductor device 100 in accordance with some embodiments. In addition, various elements of FIGS. 1A-8C are depicted using dashed lines to indicate that such elements are disposed at cross-sectional planes other than those illustrated in FIGS. 1A-8C.

Figure 1B:
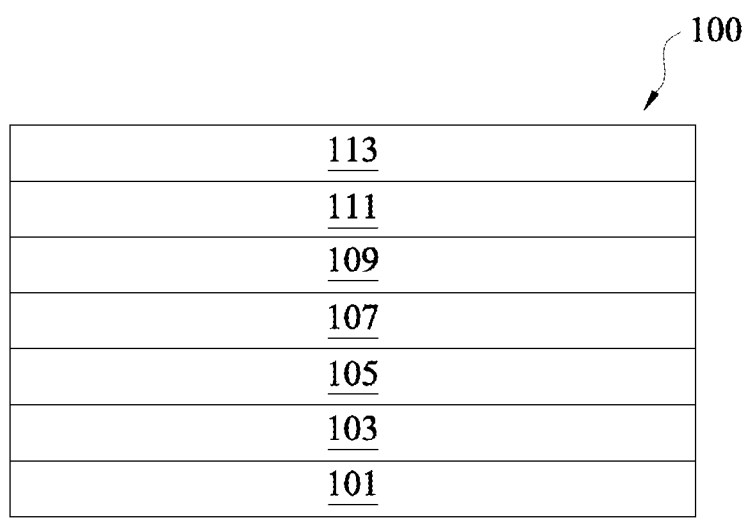
Figure 1C:
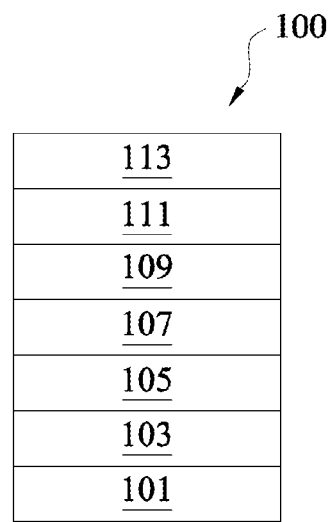

Referring first to FIGS. 1A-1C, a portion of a substrate 101 is shown having a first dielectric layer 103 formed thereon. The substrate 101 may be formed of silicon, although it may also be formed of other group III, group IV, and/or group V elements, such as germanium, gallium, arsenic, and combinations thereof. The substrate 101 may also be in the form of silicon-on-insulator (SOI). Generally, an SOI substrate comprises a layer of a semiconductor material (e.g., silicon, germanium and/or the like) formed on an insulator layer. The insulator layer may be, for example, a buried oxide (BOX) layer or a silicon oxide layer. In addition, other substrates that may be used include multi-layered substrates, gradient substrates, hybrid orientation substrates, any combinations thereof and/or the like.

The first dielectric layer 103 is formed over the substrate 101. The first dielectric layer 103 may comprise an oxide or other dielectric material, for example. The first dielectric layer 103 may comprise, for example, $SiO_2$, $Al_2O_3$, or the like, and may be formed by, for example, chemical vapor deposition (CVD), plasma enhanced chemical vapor deposition (PECVD), atomic layer deposition (ALD), or the like. In some embodiments, the first dielectric layer 103 is configured to electrically isolate the semiconductor device 100 from other devices formed on the substrate 101. In some embodiments, the first dielectric layer 103 has a thickness between about 3 nm and about 300 nm.

In some embodiments, the substrate 101 is an SOI substrate and the first dielectric layer 103 is formed over a top semiconductor layer of the SOI substrate. In other embodiments, the substrate 101 is a bottom semiconductor layer of an SOI substrate and the first dielectric layer 103 is a buried oxide (BOX) layer of the SOI substrate. In such embodiments, the top semiconductor layer of the SOI substrate is removed to expose the BOX layer.

FIGS. 1A-1C further illustrate formation of a second dielectric layer 105 on the first dielectric layer 103, a first conductive layer 107 over the second dielectric layer 105, a third dielectric layer 109 over the first conductive layer 107, a second conductive layer 111 over the third dielectric layer 109, and a fourth dielectric layer 113 over the second conductive layer 111. As described below in greater detail, a stack comprising the second dielectric layer 105, the first conductive layer 107, the third dielectric layer 109, the second conductive layer 111, and the fourth dielectric layer 113 are subsequently patterned to form a source/drain stack.

In some embodiments, the second dielectric layer 105, the third dielectric layer 109, and the fourth dielectric layer 113 may comprise similar materials and may be formed using similar methods as the first dielectric layer 103 and the description is not repeated herein. In some embodiments, the second dielectric layer 105 has a thickness between about 3 nm and about 300 nm, the third dielectric layer 109 has a thickness between about 3 nm and about 300 nm, the fourth dielectric layer 113 has a thickness between about 3 nm and about 300 nm. As described below in greater detail, the thickness of the third dielectric layer 109 determines a length of subsequently formed channel regions that are formed between the first conductive layer 107 and the second conductive layer 111.

In some embodiments, the first conductive layer 107 and the second conductive layer 111 may comprise a metallic material such as gold, silver, aluminum, copper, tungsten, molybdenum, nickel, titanium, or alloys thereof, and may be formed using physical vapor deposition (PVD), ALD, or the like. In some embodiments, the first conductive layer 107 and the second conductive layer 111 comprise a same metallic material, and such a configuration may be referred as a symmetric configuration. In other embodiments, the first conductive layer 107 and the second conductive layer 111 comprise different metallic materials, and such a configuration may be referred as an asymmetric configuration. In some embodiments, the first conductive layer 107 has a thickness between about 3 nm and about 300 nm, and the second conductive layer 111 has a thickness between about 3 nm and about 300 nm. As described below in greater detail, the first conductive layer 107 and the second conductive layer 111 are patterned to form source/drain electrodes.

In some embodiments, the first conductive layer 107 and the second conductive layer 111 include diffusion barrier layers (not shown) to protect neighboring layers form metal diffusion. For example, a first diffusion barrier layer (not shown) is interposed between the first conductive layer 107 and the second dielectric layer 105, a second diffusion barrier layer (not shown) is interposed between the first conductive layer 107 and the third dielectric layer 109, a third diffusion barrier layer (not shown) is interposed between the second conductive layer 111 and the third dielectric layer 109, and a fourth diffusion barrier layer (not shown) is interposed between the second conductive layer 111 and the fourth dielectric layer 113. In some embodiments, diffusion barrier layers are metal-containing layers. Exemplary materials for forming diffusion barrier layers include titanium, titanium nitride, tantalum, tantalum nitride, tungsten, platinum, the like, or a combination thereof. In some embodiments, diffusion barrier layers are formed using PVD, ALD, or the like.

Figure 2A:
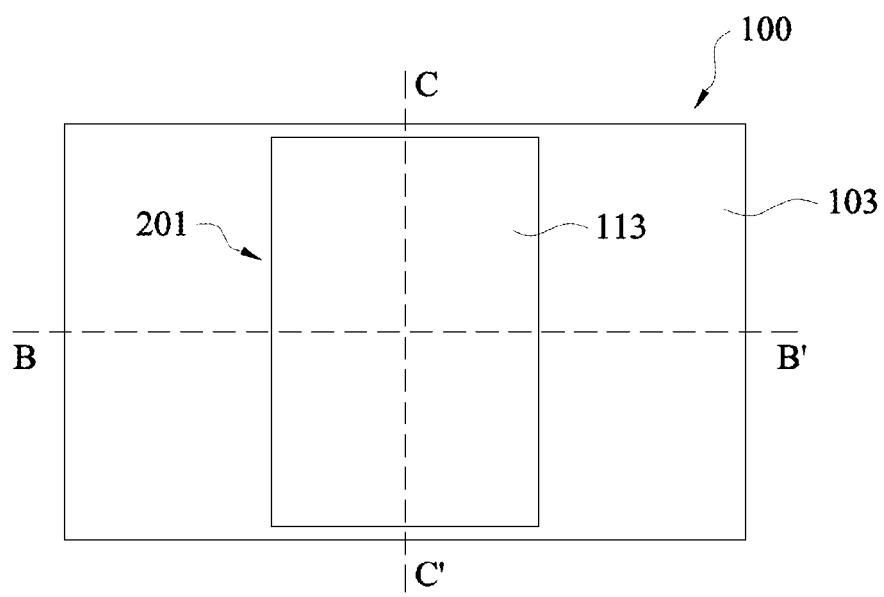
Figure 2B:
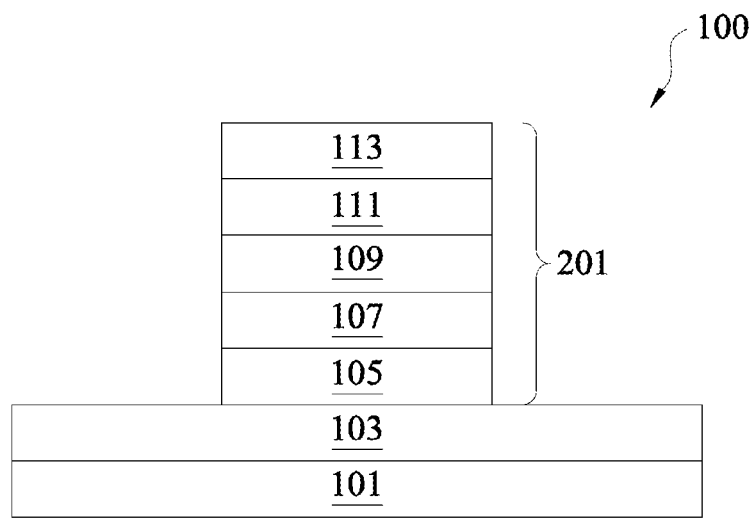
Figure 2C:
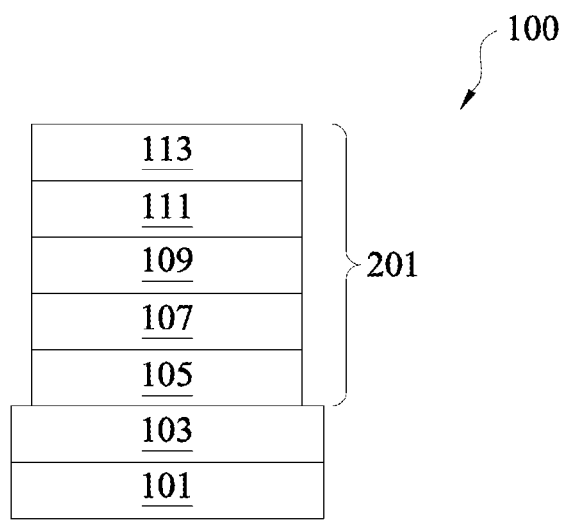

Referring to FIGS. 2A-2C, the stack of the second dielectric layer 105, the first conductive layer 107, the third dielectric layer 109, the second conductive layer 111, and the fourth dielectric layer 113 is patterned to form the source/drain electrode stack 201. Throughout the description, the first conductive layer 107 may also be referred to as a first source/drain electrode 107, and the second conductive layer 111 may also be referred to as a second source/drain electrode 111. In some embodiments wherein the first source/drain electrode 107 and the second source/drain electrode 111 are formed of a same conductive material, the source/drain electrode stack 201 may also be referred to as a symmetric source/drain electrode stack. In the embodiments wherein the first source/drain electrode 107 and the second source/drain electrode 111 are formed of different conductive materials, the source/drain electrode stack 201 may also be referred to as an asymmetric source/drain electrode stack.

In some embodiments, the stack of the second dielectric layer 105, the first conductive layer 107, the third dielectric layer 109, the second conductive layer 111, and the fourth dielectric layer 113 is patterned using photolithography techniques. Generally, photolithography involves depositing a photoresist material (not shown), which is then masked, exposed, and developed. After the photoresist mask is patterned, a one or more etching process may be performed to remove unwanted portions of the underlying material. Additional masks (not shown), for example, hard masks, may be utilized in the one or more etching processes. Subsequently, excess portions of the photoresist material may be removed using, for example, an ashing process combined with a wet clean process.

In some embodiments, the stack of the second dielectric layer 105, the first conductive layer 107, the third dielectric layer 109, the second conductive layer 111, and the fourth dielectric layer 113 is patterned using a single etching process such as, for example, an anisotropic dry etching process. In such embodiments, the single etching process etches all layers of the stack. In other embodiments, individual layers of the stack may be patterned using individual etching processes. In some embodiments, individual dielectric layers (such as the second dielectric layer 105, the third dielectric layer 109, and the fourth dielectric layer 113) formed of $SiO_2$ may be patterned by, for example, a wet etching process using dilute hydrofluoric acid. In other embodiments, individual dielectric layers (such as the second dielectric layer 105, the third dielectric layer 109, and the fourth dielectric layer 113) formed of $Al_2O_3$ may be patterned by, for example, a reactive ion etch (RIE) process using gases such as $CF_4/O_2$, $BCl_3$, $BCl_3/HBr$, $Cl_2$, $Cl_2/Ar$, or the like. In some embodiments, individual conductive layers (such as the first conductive layer 107 and the second conductive layer 111) of the stack may be patterned using, for example, suitable wet or dry etching processes.

Figure 3A:
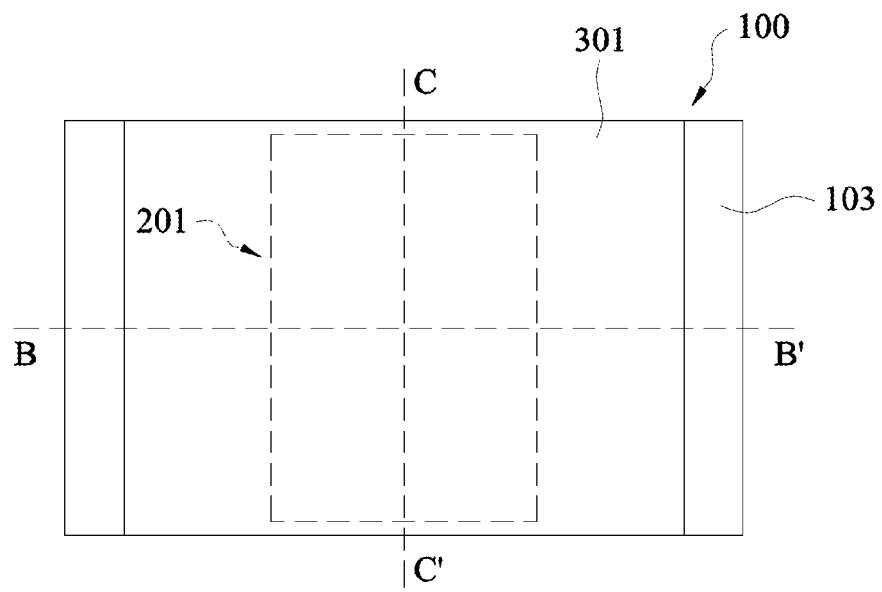
Figure 3B:
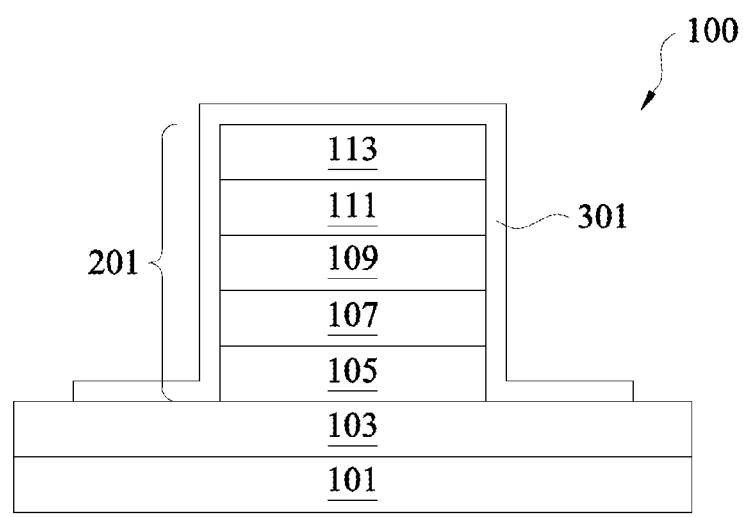
Figure 3C:
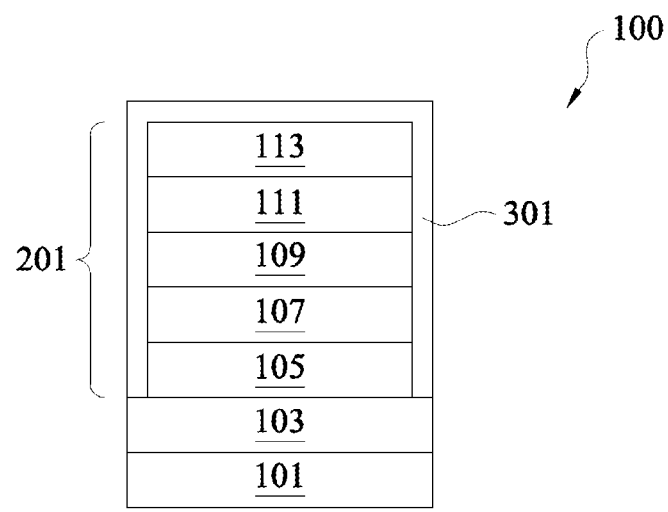

Referring to FIGS. 3A-3C, a 2D material layer 301 is conformally formed over the source/drain electrode stack 201 and the first dielectric layer 103. The 2D material layer 301 may comprise one to a few monolayers of TMDCs, graphene, and boron nitride (BN). Generally, TMDCs are semiconductor materials of the chemical formula $MX_2$, with M a transition metal atom (such as, for example, Mo, W, and the like) and X a chalcogen atom (such as S, Se, Te). Examples of suitable TMDCs include $MoS_2$, $WS_2$, $WSe_2$, $MoSe_2$, $MoTe_2$, and the like. A monolayer of a TMDC material comprises one layer of M atoms sandwiched between two layers of X atoms. In an embodiment with a 2D material layer comprising a single $MoS_2$ monolayer, the 2D material layer has a thickness about 0.65 nm. In some embodiments, a 2D material layer is formed using, for example, ALD, CVD, PECVD, atmospheric-pressure CVD (APCVD), low-pressure CVD (LPCVD), the like, or combinations thereof. In some embodiments, the 2D material layer 301 comprising $MoS_2$ may be formed using, for example, APCVD using precursors such as $MoO_3$ and S at a temperature of about 650° C., or ALD using precursors such as $MoCl_5$ and $H_2S$ at a temperature of about 300° C. In some embodiments, the 2D material layer 301 comprising $WS_2$ may be formed using, for example, ALD using precursors such as $WF_5$ and $H_2S$ at a temperature range of about 250° C. to about 300° C. In some embodiments, the 2D material layer 301 has a thickness between about 0.65 nm and about 20 nm.

Referring further to FIGS. 3A-3C, the 2D material layer 301 is patterned such that portions of the 2D material layer 301 covering the first dielectric layer 103 are removed. In some embodiments, 2D material layer 301 may be patterned using photolithography techniques. A photoresist material (not shown) is deposited on the 2D material layer 301, which is then masked, exposed, and developed. After the photoresist mask is patterned, an etching process may be performed to remove unwanted portions of the 2D material layer 301. Additional masks (not shown), for example, hard masks, may be utilized in the etching processes. Subsequently, excess portions of the photoresist material may be removed using, for example, an ashing process in combination with a wet clean process. In some embodiments, the etching process may include a suitable wet or dry etching process. As described below in greater detail, channel and source/drain regions are formed in the 2D material layer 301.

Figure 4A:
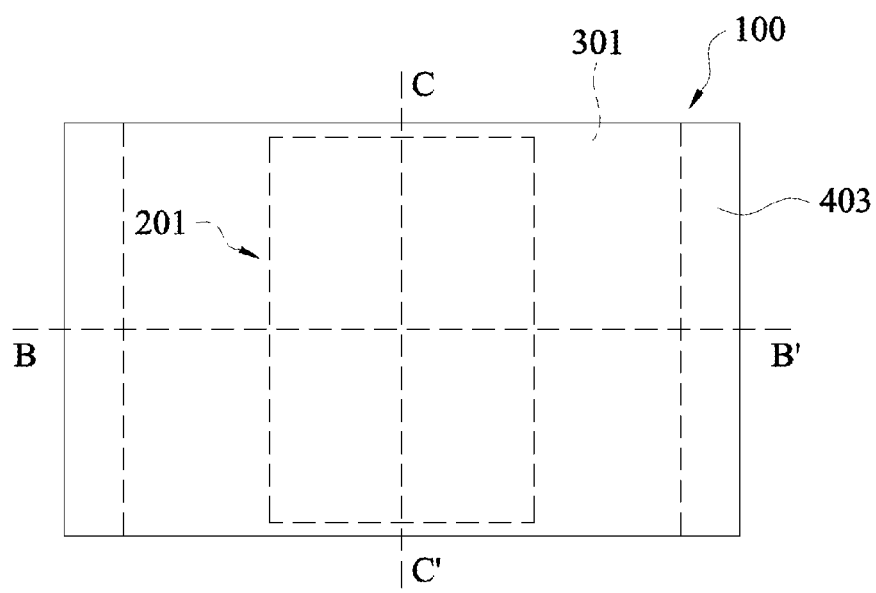
Figure 4B:
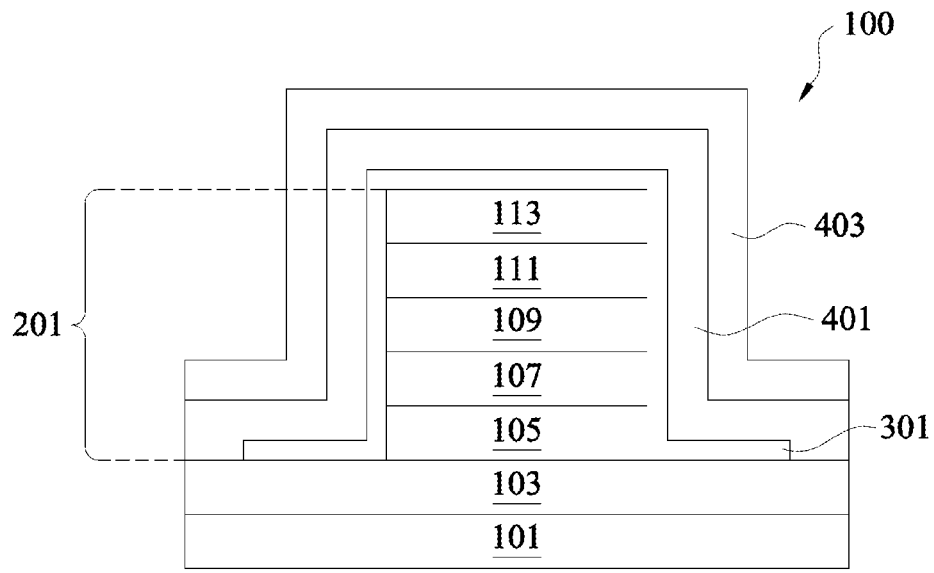
Figure 4C:
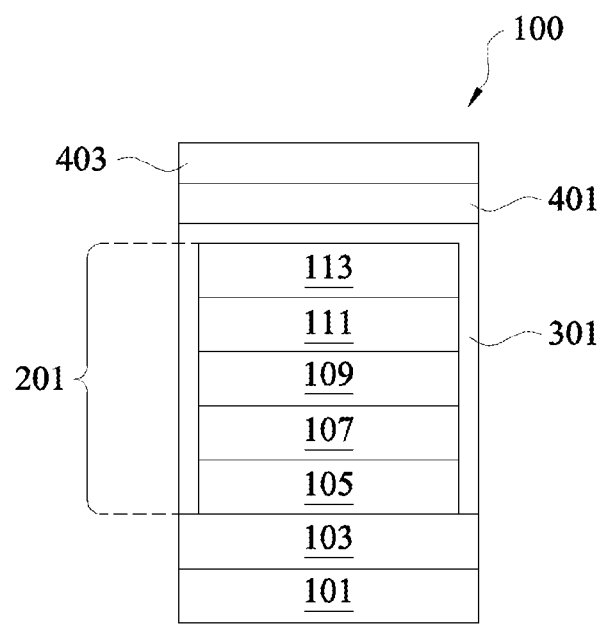

Referring to FIGS. 4A-4C, a fifth dielectric layer 401 and a third conductive layer 403 are conformally formed on the 2D material layer 301 and the first dielectric layer 103. As described below in greater detail, the fifth dielectric layer 401 and the third conductive layer 403 are subsequently patterned to form a gate dielectric 505 and a gate electrode 507, respectively (See FIGS. 5A-5C). In some embodiments, the fifth dielectric layer 401 comprises one or more layers of high-k dielectric materials. Generally, a high-k dielectric material has a dielectric constant (k-value) higher than 3.9. For example, the fifth dielectric layer 401 may include one or more layers of a metal oxide or a silicate of Hf, Al, Zr, combinations thereof, and multi-layers thereof. Other suitable materials include La, Mg, Ba, Ti, Pb, Zr, in the form of metal oxides, metal alloyed oxides, or combinations thereof. Exemplary materials include $MgO_x$, $BaTi_xO_y$, $BaSr_xTi_yO_z$, $PbTi_xO_y$, $PbZr_xTi_yO_z$, or the like. In some embodiments, the fifth dielectric layer 401 may be formed using ALD, CVD, PECVD, molecular-beam deposition (MBD), or the like. In some embodiments, the fifth dielectric layer 401 has a thickness between about 0.5 nm and about 100 nm.

Referring further to FIGS. 4A-4C, the third conductive layer 403 is conformally formed on the fifth dielectric layer 401. In some embodiments, the third conductive layer 403 may comprise on or more layers of highly doped polysilicon, a metallic material, or any suitable conductive material, and may be formed using ALD, CVD, PVD, or the like. In some embodiments, the third conductive layer 403 has a thickness between about 10 nm and about 1000 nm. As described below in greater detail, the fifth dielectric layer 401 and the third conductive layer 403 are patterned to form a gate stack 503 (See FIGS. 5A-5C).

Figure 5A:
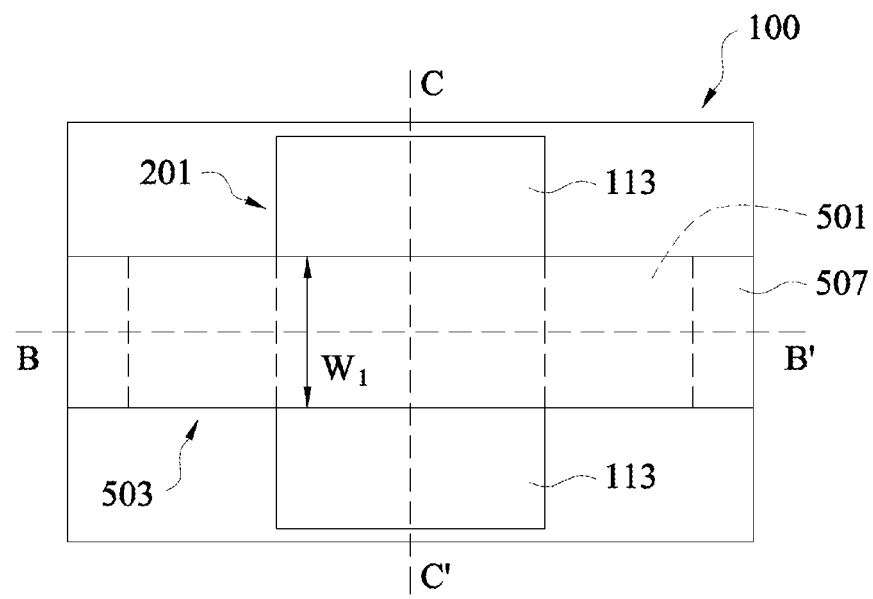
Figure 5B:
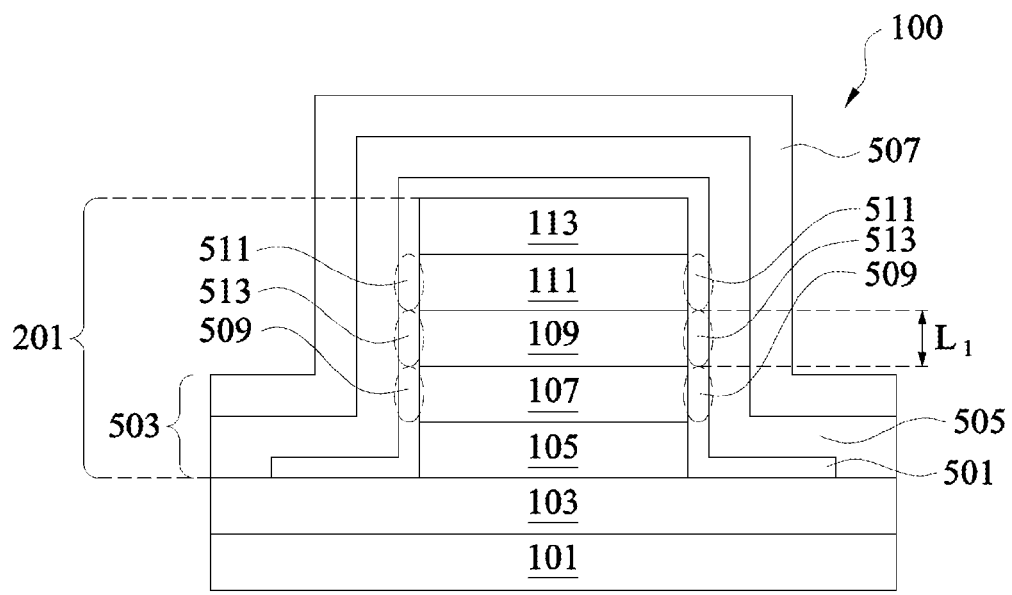
Figure 5C:
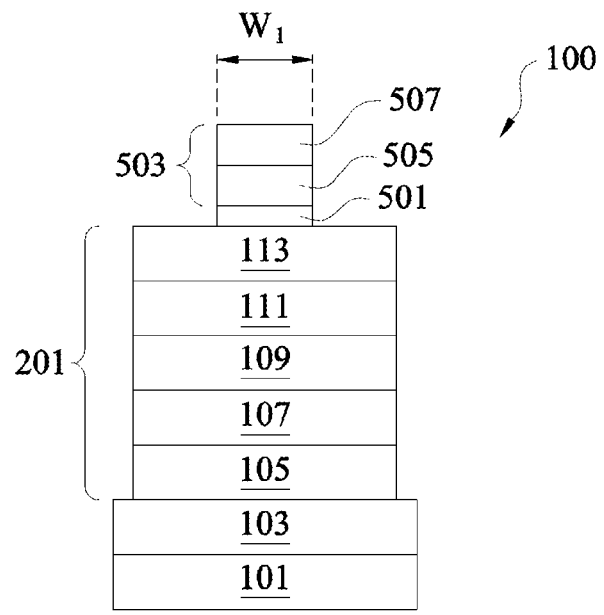

Referring to FIGS. 5A-5C, the 2D material layer 301, the fifth dielectric layer 401 and the third conductive layer 403 are patterned to form a source/channel/drain layer 501, and the gate stack 503 on the source/channel/drain layer 501. The gate stack 503 comprises the gate dielectric 505 and the gate electrode 507 disposed on the gate dielectric 505. In the illustrated embodiment, the gate stack 503 and the source/channel/drain layer 501 have a first width $W_1$ between 1 nm about and about 1 μm.

Referring further to FIGS. 5A-5C, the 2D material layer 301, the fifth dielectric layer 401 and the third conductive layer 403 may be patterned using photolithography techniques. In some embodiments, a photoresist material (not shown) is deposited on the third conductive layer 403, which is then masked, exposed, and developed. After the photoresist mask is patterned, one or more etching processes may be performed to remove unwanted portions of the 2D material layer 301, the fifth dielectric layer 401 and the third conductive layer 403. Additional masks (not shown), for example, hard masks, may be utilized in the one or more etching processes. Subsequently, excess portions of the photoresist material may be removed using, for example, an ashing process in combination with a wet clean process. In some embodiments, the stack of the 2D material layer 301, the fifth dielectric layer 401 and the third conductive layer 403 is patterned using a single etching process such as, for example, an anisotropic dry etching process. In other embodiments, the 2D material layer 301, the fifth dielectric layer 401 and the third conductive layer 403 may be patterned using individual etching processes. In such embodiments, individual etching processes are chosen based on materials forming the 2D material layer 301, the fifth dielectric layer 401 and the third conductive layer 403.

Referring further to FIGS. 5A-5C, the source/channel/drain layer 501 comprises first source/drain regions 509, second source/drain regions 511, and channel regions 513. Each of the channel regions 513 is disposed between a corresponding first source/drain region 509 and a corresponding second source/drain region 511. In the illustrated embodiment, the channel regions 513 are regions of the source/channel/drain layer 501 that are disposed at sidewalls of the third dielectric layer 109. Accordingly, the channel regions 513 have a first length $L_1$, which is substantially equal to the thickness of the third dielectric layer 109. Moreover, the first length $L_1$ is limited by the thickness of the third dielectric layer 109 and, therefore, may be scaled below the photolithography limit. In some embodiment, the first length $L_1$ is between about 3 nm and about 300 nm.

Referring further to FIGS. 5A-5C, the first source/drain regions 509 are regions of the source/channel/drain layer 501 that are disposed at sidewalls of the first source/drain electrode 107, and the second source/drain regions 511 are regions of the source/channel/drain layer 501 that are disposed at sidewalls of the second source/drain electrode 111. Accordingly, the first source/drain regions 509 have a length, which is substantially equal to the thickness of the first source/drain electrode 107, and the second source/drain regions 511 have a length, which is substantially equal to the thickness of the second source/drain electrode 111.

In the embodiment wherein the source/channel/drain layer 501 comprises a semiconductor material (such as a TMDC material) and the first source/drain electrode 107 and the second source/drain electrode 111 comprise metallic materials, metal/semiconductor junctions are formed at interfaces between the first source/drain electrode 107 and the first source/drain regions 509, and the second source/drain regions 511 and the second source/drain electrode 111. In such embodiments, the first source/drain regions 509 and the second source/drain regions 511 comprise Schottky barriers and may also be referred to as the first Schottky Barrier (SB) source/drain regions 509 and the second SB source/drain regions 511, respectively. In general, the Schottky barrier is a potential barrier for carriers, such as electrons, that impedes a flow of the carriers from a metal region to a semiconductor region in a metal/semiconductor junction. In some embodiments, a height of the Schottky barrier, and thus, properties of the metal/semiconductor junction may be tuned by carefully matching metal and semiconductor materials that form the metal/semiconductor junction. In an embodiment wherein the source/drain electrode stack is a symmetric source/drain electrode stack, the first source/drain regions 509 and the second source/drain regions 511 have Schottky barriers with a same barrier height. In another embodiment wherein the source/drain electrode stack is an asymmetric source/drain electrode stack, the first source/drain regions 509 and the second source/drain regions 511 may have Schottky barriers with different barrier heights. In some embodiments, the height of the Schottky barrier may be reduced or eliminated to form an Ohmic metal/semiconductor junction. For example, an Ohmic metal/semiconductor junction is formed at the interface of $MoS_2$ and Mo, or at the interface of $MoS_2$ and Ti. In other embodiments, the height of the Schottky barrier may be increased to form a rectifying metal/semiconductor junction. In some embodiments wherein the height of the Schottky barrier is larger than the thermal energy of carriers, a current through the metal/semiconductor junction flows predominantly due to quantum tunneling of the carriers under the Schottky barrier. In such embodiments, the semiconductor device 100 may be configured as a tunnel device.

Figure 6A:
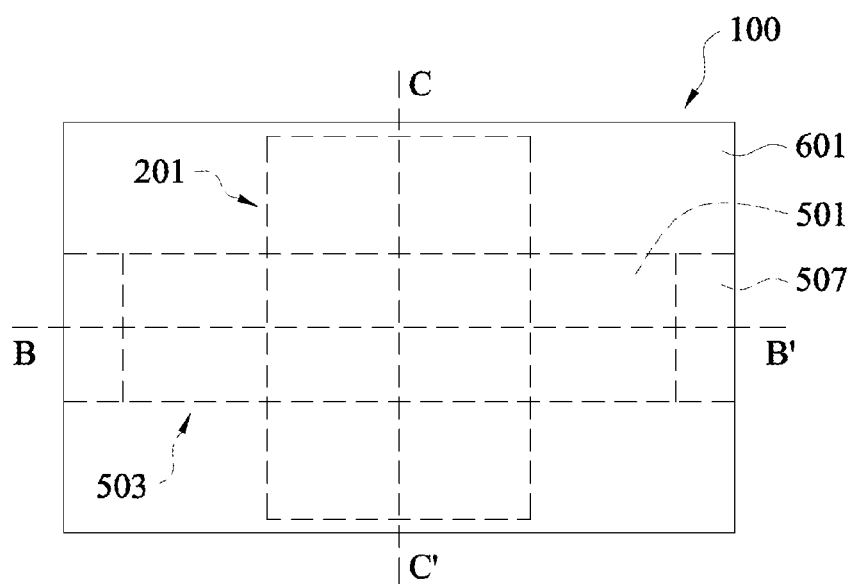
Figure 6B:
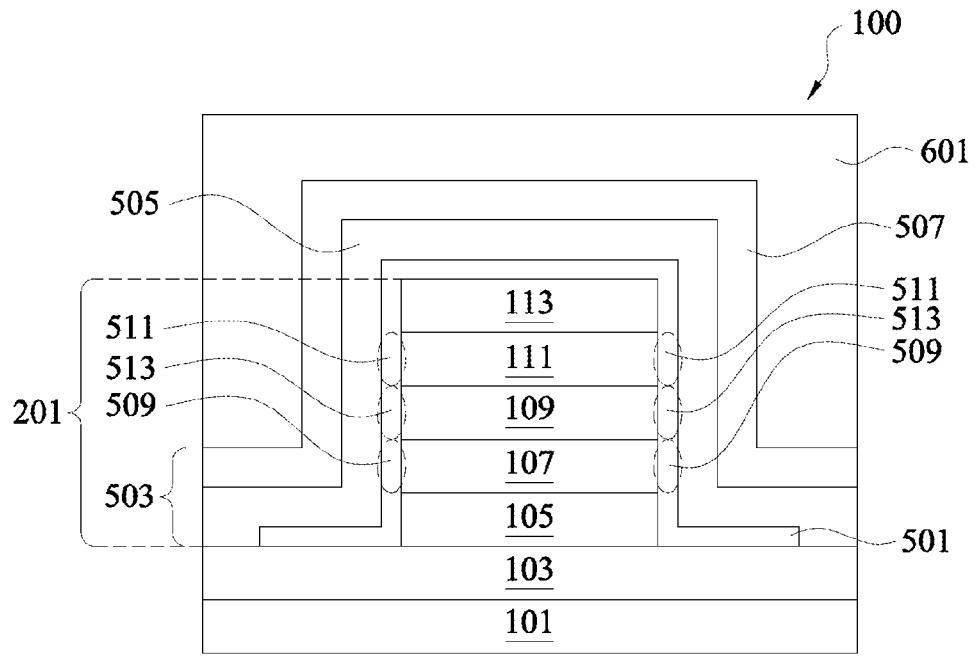
Figure 6C:
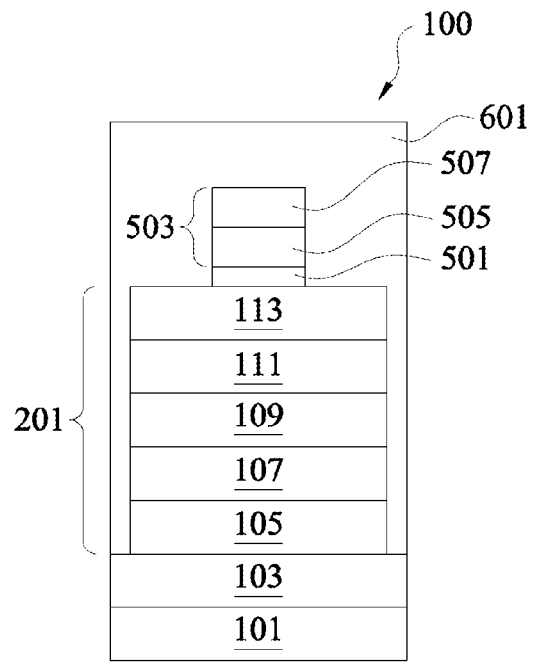

Referring to FIGS. 6A-6C, an interlayer dielectric (ILD) layer 601 is formed over the source/drain electrode stack 201 and the gate stack 503. In some embodiments, the ILD layer 601 is formed of one or more layers of dielectric material, such as silicon oxide, low-k dielectrics or other suitable materials, by a suitable technique, such as CVD, ALD, spin-on, or the like. A chemical mechanical polishing (CMP) process may be performed to remove excess dielectric material from the ILD layer 601.

Figure 7A:
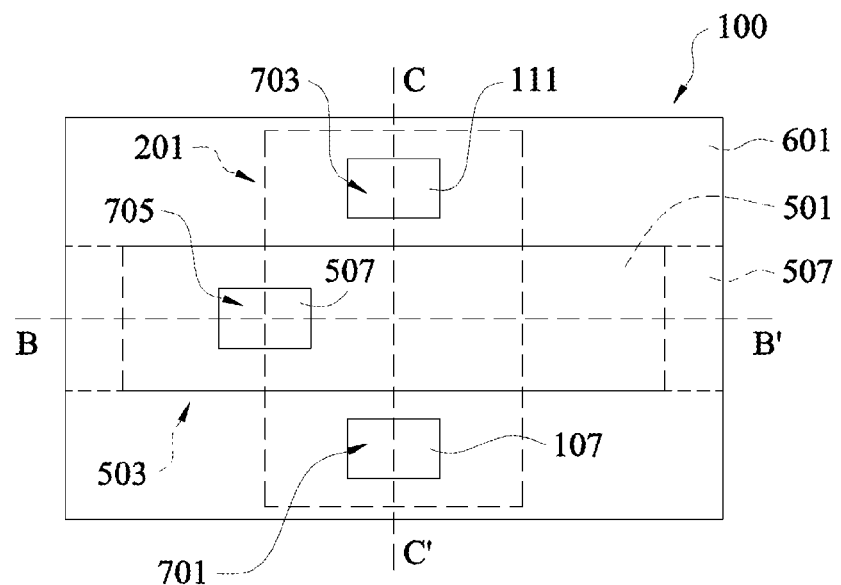
Figure 7B:
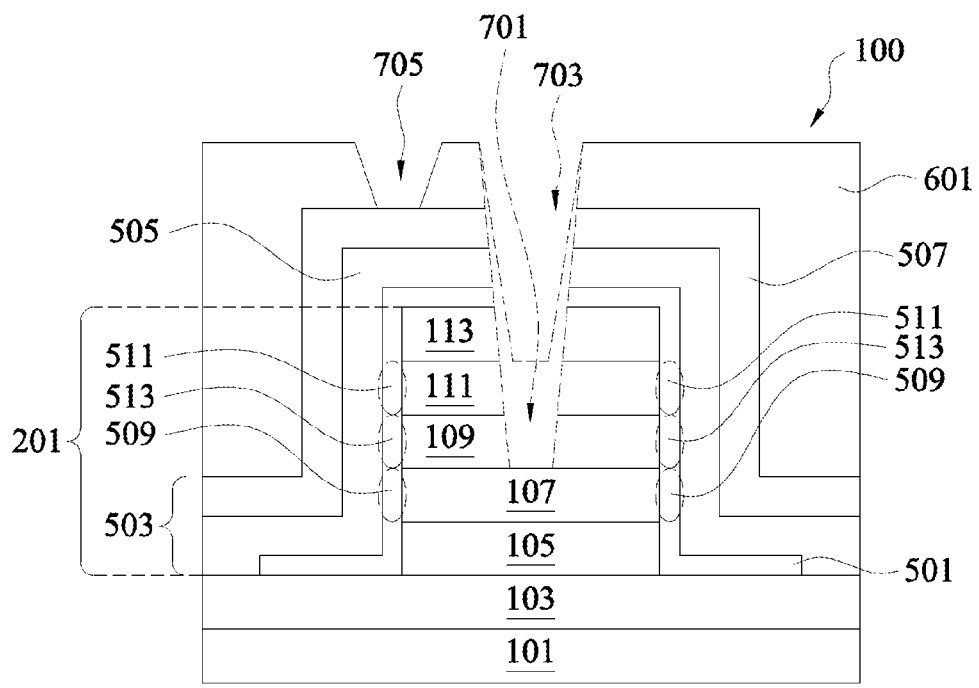
Figure 7C:
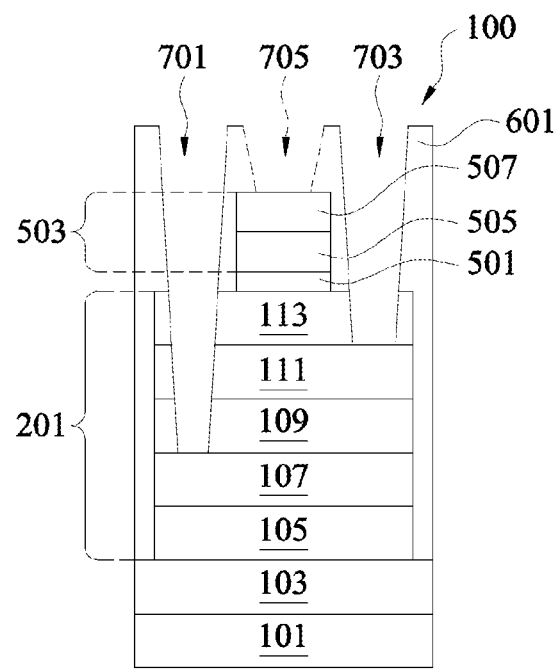

Referring to FIGS. 7A-7C, a first opening 701, a second opening 703 and a third opening 705 are formed through various layers of the semiconductor device 100 to expose the first source/drain electrode 107, the second source/drain electrode 111 and the gate electrode 507, respectively. As described below in greater detail, conductive plugs are formed in the first opening 701, the second opening 703 and the third opening 705 to provide electrical connections to the first source/drain electrode 107, the second source/drain electrode 111 and the gate electrode 507, respectively.

In some embodiments, the first opening 701, the second opening 703 and the third opening 705 are formed using photolithography techniques. In some embodiments, the first opening 701, the second opening 703 and the third opening 705 are formed at the same time during same patterning processes. In other embodiments, the first opening 701, the second opening 703 and the third opening 705 are formed sequentially using a plurality of patterning processes. In the illustrated embodiment, the first opening 701 extends though the ILD layer 601, the fourth dielectric layer 113, the second source/drain electrode 111, the third dielectric layer 109, and exposes the first source/drain electrode 107. The second opening 703 extends though the ILD layer 601, the gate stack 503, the source/channel/drain layer 501, the fourth dielectric layer 113, and exposes the second source/drain electrode 111. The third opening 705 extends though the ILD layer 601 and exposes the gate electrode 507.

Referring further to FIG. 7B, the first opening 701 and the second opening 703 are depicted by dashed lines to indicate that the first opening 701 and the second opening 703 are formed in cross-sectional planes different from the cross-sectional plane shown in FIG. 7B. Referring further to 7C, the third opening 705 is depicted by dashed lines to indicate that the third opening 705 is formed in a cross-sectional plane different from the cross-sectional plane shown in FIG. 7C.

Figure 8A:
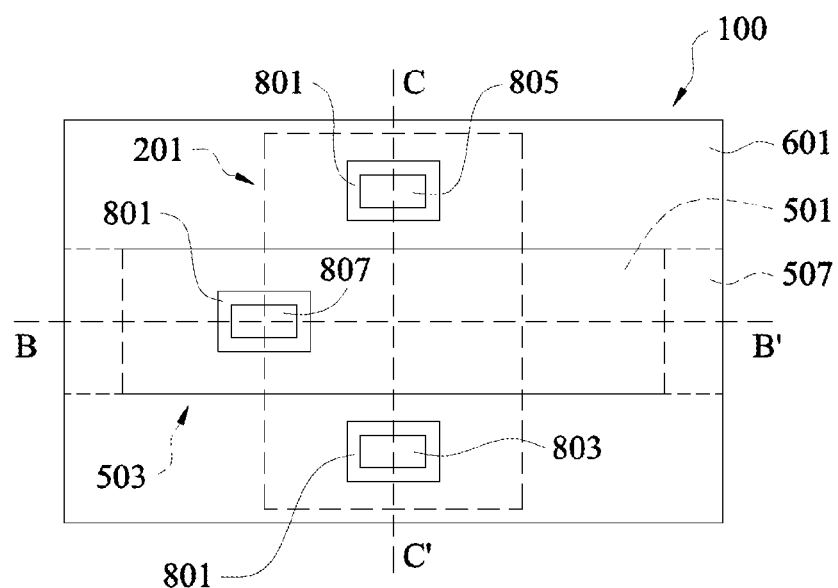
Figure 8B:
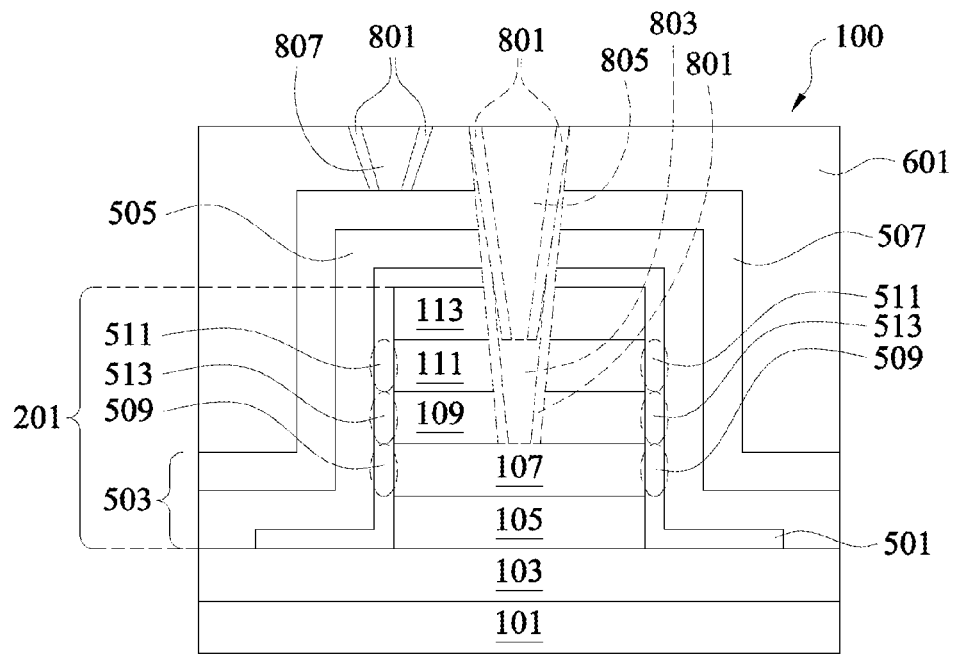
Figure 8C:
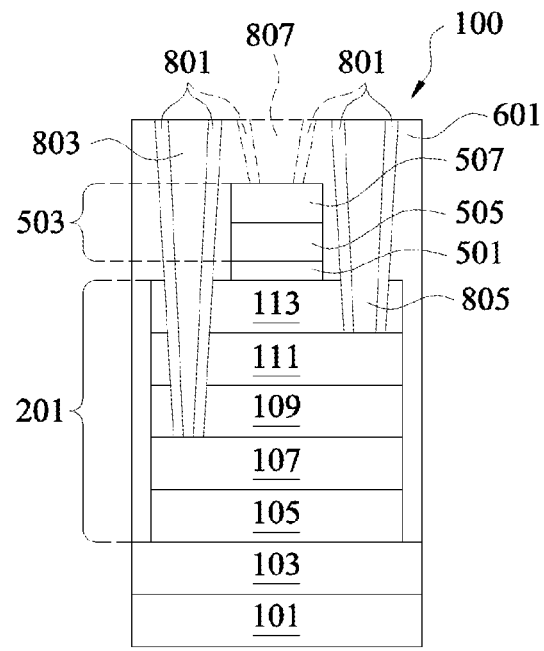

Referring to FIGS. 8A-8C, a first conductive plug 803, a second conductive plug 805, and a third conductive plug 807 are formed in the first opening 701, the second opening 703 and the third opening 705, respectively. In the illustrated embodiment, the first conductive plug 803 provides an electrical connection to the first source/drain electrode 107, the second conductive plug 805 provides an electrical connection to the second source/drain electrode 111, and the third conductive plug 807 provides an electrical connection to the gate electrode 507.

Referring to FIG. 8A, in the illustrated embodiment, the first conductive plug 803, the second conductive plug 805 and the third conductive plug 807 have rectangular shapes as viewed from top. In other embodiments, the first conductive plug 803, the second conductive plug 805 and the third conductive plug 807 may have various shapes such as circular shapes, oval shapes, square shapes, polygonal shapes, or the like.

Referring further to FIGS. 8A-8C, in some embodiments, a liner layer 801 is formed along sidewalls of the first opening 701, the second opening 703 and the third opening 705 to isolate the first conductive plug 803, the second conductive plug 805, and the third conductive plug 807 from the neighboring layers. In some embodiments, the liner layer may comprise silicon oxide. However, in other embodiments, any suitable dielectric material may be also used to form the liner layer 801. In some embodiments, liner layer 801 is conformally formed over the first opening 701, the second opening 703 and the third opening 705 using, for example, CVD, ALD, the like, or a combination thereof. Subsequently, horizontal portions of the liner layer 801 are removed such that the liner layer 801 remains on the sidewalls of the first opening 701, the second opening 703 and the third opening 705. In some embodiments, the horizontal portions of the liner layer 801 are removed using a suitable anisotropic dry etching process, or the like.

Referring further to FIGS. 8A-8C, in some embodiments, one or more barrier/adhesion layers (not shown) are conformally formed over the liner layer 801. The one or more barrier/adhesion layers protect neighboring layers (such as, for example, the ILD layer 601) from metallic diffusion. The one or more barrier/adhesion layers may comprise titanium, titanium nitride, tantalum, tantalum nitride, or the like and may be formed using PVD, CVD, ALD, the like, or a combination thereof. In some embodiments, a seed layer (not shown) is conformally formed over the one or more barrier/adhesion layers. The seed layer may comprise copper, titanium, nickel, gold, manganese, the like, or a combination thereof, and may be formed by ALD, PVD, the like, or a combination thereof.

Subsequently, the first conductive plug 803, the second conductive plug 805, and the third conductive plug 807 are formed by filling the first opening 701, the second opening 703 and the third opening 705, respectively, with a suitable conductive material. In some embodiments, the first conductive plug 803, the second conductive plug 805, and the third conductive plug 807 may comprise copper, a copper alloy, silver, gold, tungsten, tantalum, aluminum, and the like, and may be formed using an electro-chemical plating process, an electroless plating process, ALD, PVD, the like, or a combination thereof.

In some embodiments, excess materials overfilling the first opening 701, the second opening 703 and the third opening 705 are removed such that the topmost surfaces of the first conductive plug 803, the second conductive plug 805, and the third conductive plug 807 are substantially coplanar with the topmost surface of the ILD layer 601. In some embodiments, the excess materials are removed using, for example, a mechanical grinding process, a CMP process, an etching process, the like, or a combination thereof.

In some embodiments, further manufacturing steps may be performed on the semiconductor device 100. For example, metallization layers (not shown) may be formed over the ILD layer 601. The metallization layers may comprise one or more dielectric layers, and one or more conductive features formed in the one or more dielectric layers. In some embodiments, the metallization layers are in electrical contact with the first conductive plug 803, the second conductive plug 805 and the third conductive plug 807 and electrically interconnect the semiconductor device 100 to other devices formed on the substrate 101. In some embodiments, the further manufacturing steps may also include formation of one or more redistribution layers (RDLs) over the metallization layers, formation of under-bump metallizations (UBMs) over the RLDs, and formation of connectors over the UBMs. Subsequently, the substrate 101 may be singulated into separate dies, which may further undergo various packaging processes.

Figure 9A:
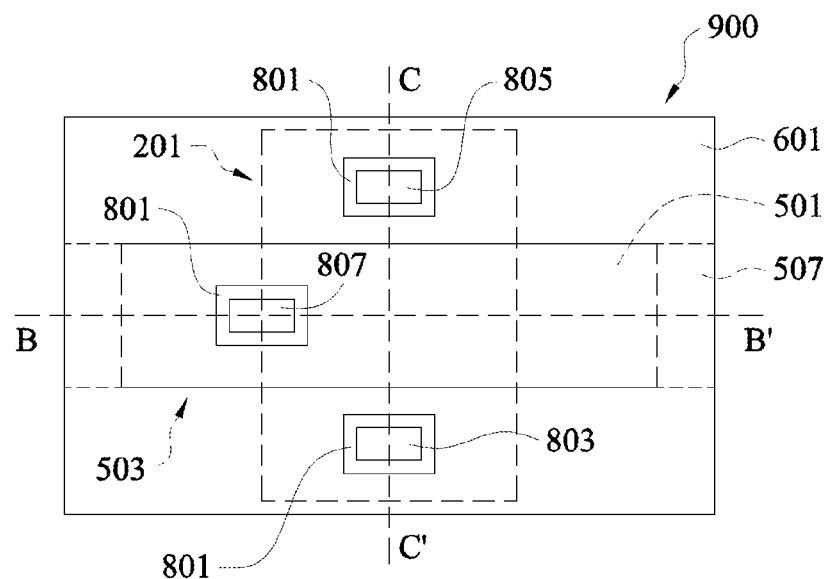
FIG. 9A illustrates a top view of a semiconductor device in accordance with some alternative embodiments.
Figure 9B:
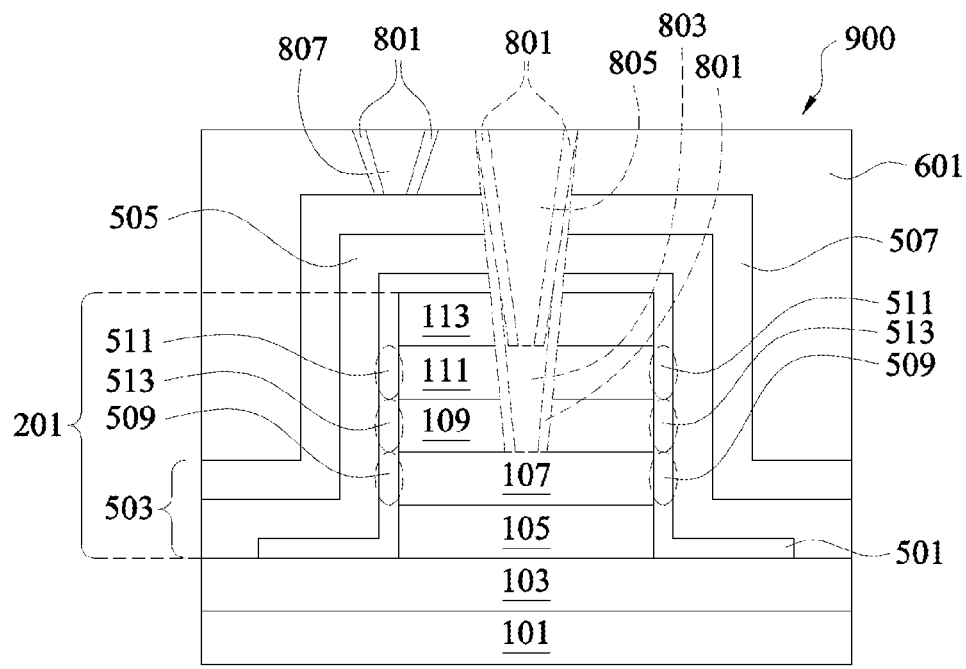
FIG. 9B illustrates a first cross-sectional view of the semiconductor device in accordance with some alternative embodiments.
Figure 9C:
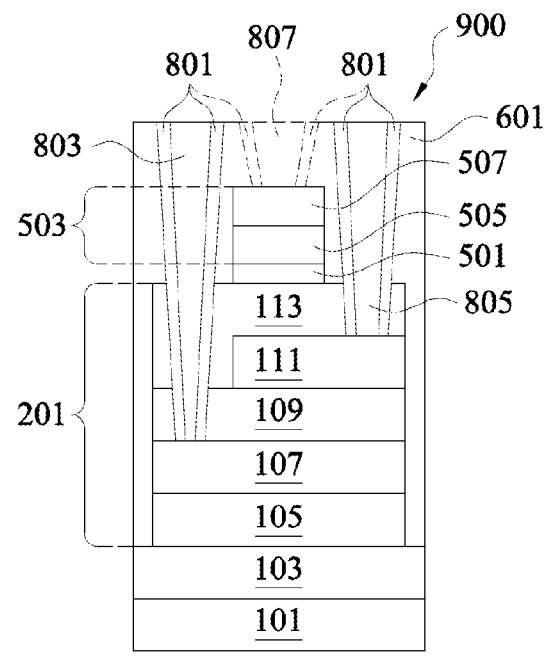
FIG. 9C illustrates a second cross-sectional view of the semiconductor device in accordance with some alternative embodiments.

FIGS. 9A-9C illustrate a semiconductor device 900 in accordance with some embodiments. In particular, FIG. 9A illustrates a top view, FIG. 9B illustrates a first cross-sectional view along the B-B' line of FIG. 9A, FIG. 9C illustrates a second cross-sectional view along the C-C' line (perpendicular to the B-B' line) of FIG. 9A. In addition, various elements of FIGS. 9A-9C are depicted using dashed lines to indicate that such elements are disposed at cross-sectional planes other than those illustrated in FIGS. 9A-9C.

Referring further to FIGS. 9A-9C, the semiconductor device 900 is similar to the semiconductor device 100 and may be formed using a method similar to that described above with reference to FIGS. 1A-8C. Therefore, the detailed description is not repeated herein. In the illustrated embodiment, the source/drain electrode stack 201 is formed such that the first source/drain electrode 107 and the second source/drain electrode 111 have different widths. In some embodiments, a width of the first source/drain electrode 107 is larger than a width of the second source/drain electrode 111. Accordingly, in such embodiments, the first conductive plug 803 extends through the ILD layer 601, the fourth dielectric layer 113, the third dielectric layer 109, and contacts the first source/drain electrode 107 without extending through the second source/drain electrode 111. In some embodiments, the liner layer 801 may not be formed along sidewalls of the first conductive plug 803.

Figure 10A:
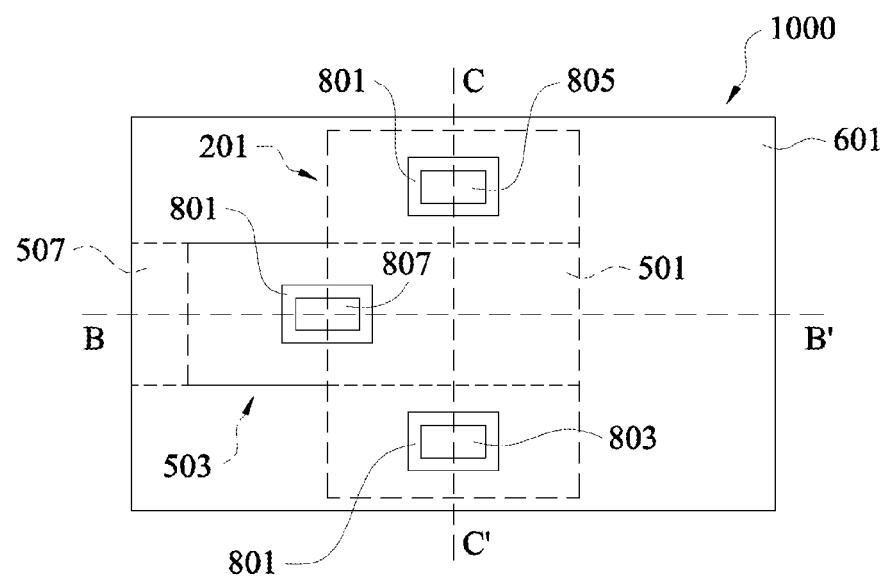
FIG. 10A illustrates a top view of a semiconductor device in accordance with some alternative embodiments.
Figure 10B:
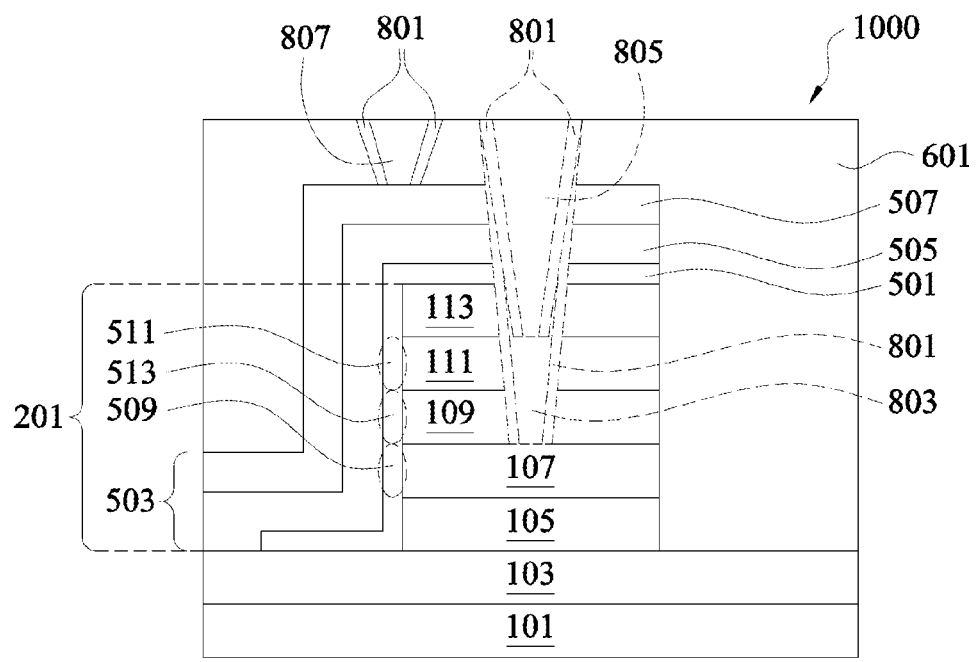
FIG. 10B illustrates a first cross-sectional view of the semiconductor device in accordance with some alternative embodiments.
Figure 10C:
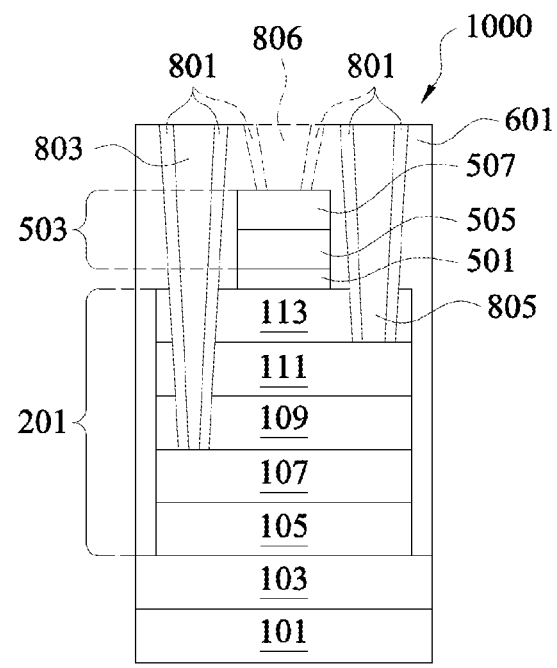
FIG. 10C illustrates a second cross-sectional view of the semiconductor device in accordance with some alternative embodiments.

FIGS. 10A-10C illustrate a semiconductor device 1000 in accordance with some embodiments. In particular, FIG. 10A illustrates a top view, FIG. 10B illustrates a first cross-sectional view along the B-B' line of FIG. 10A, FIG. 10C illustrates a second cross-sectional view along the C-C' line (perpendicular to the B-B' line) of FIG. 10A. In addition, various elements of FIGS. 10A-10C are depicted using dashed lines to indicate that such elements are disposed at cross-sectional planes other than those illustrated in FIGS. 10A-10C.

Referring further to FIGS. 10A-10C, the semiconductor device 1000 is similar to the semiconductor device 100 and may be formed using a method similar to that described above with reference to FIGS. 1A-8C. Therefore, the detailed description is not repeated herein. In the illustrated embodiment, the source/channel/drain layer 501 is formed only on a left sidewall of the source/drain electrode stack 201. However, in other embodiments, the source/channel/drain layer 501 may be formed only on a right sidewall of the source/drain electrode stack 201. Accordingly, in the illustrated embodiment, the source/channel/drain layer 501 comprises one first source/drain region 509, one second source/drain region 511, and one channel region 513.

Figure 11:
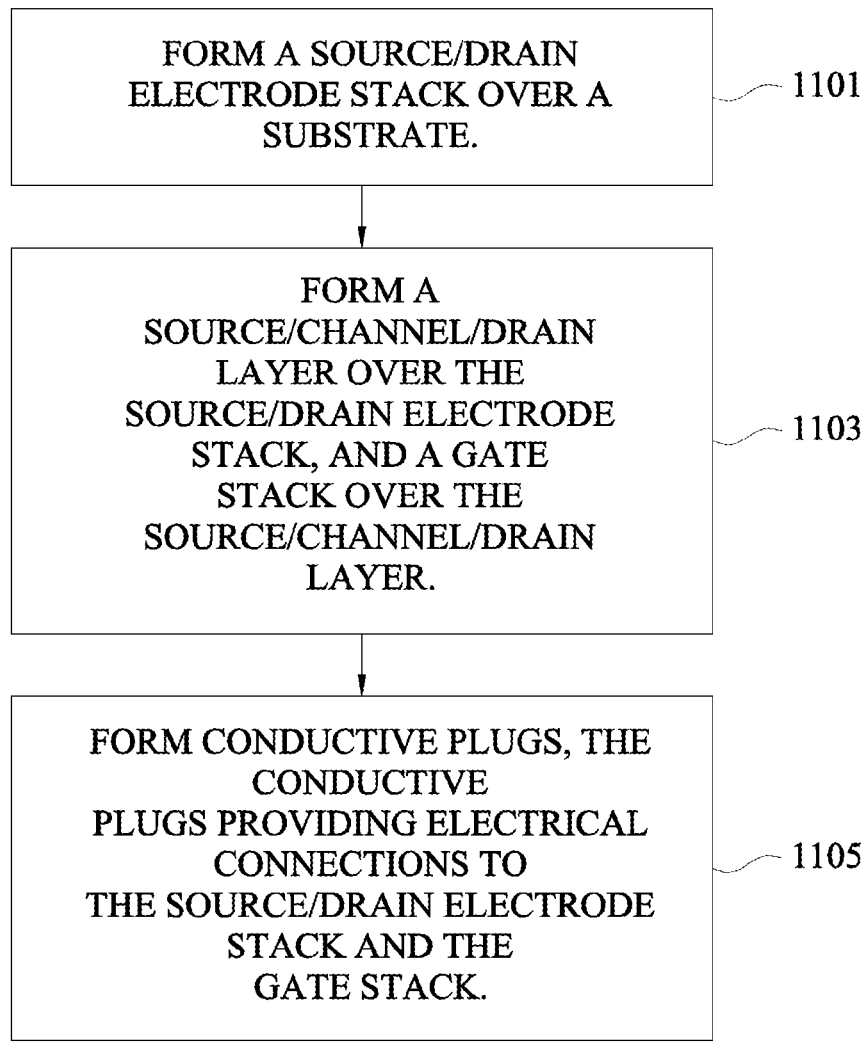
FIG. 11 is a flow diagram illustrating a method of forming a semiconductor device in accordance with some embodiments.

FIG. 11 is a flow diagram illustrating a method of forming a semiconductor device in accordance with some embodiments. The method starts at step 1101, wherein a source/drain electrode stack (such as the source/drain electrode stack 201) is formed over a substrate as described above with reference to FIGS. 1A-2C. In some embodiments, a stack of layers comprising a first dielectric layer, a first conductive layer on the first dielectric layer, a second dielectric layer on the first conductive layer, a second conductive layer on the second dielectric layer, and a third dielectric layer on the second conductive layer is formed over the substrate as described above with reference to FIGS. 1A-1C. Subsequently, the stack of layers is patterned to form the source/drain electrode stack as described above with reference to FIGS. 2A-2C.

During step 1103, a source/channel/drain layer (such as the source/channel/drain layer 501) is formed over the source/gate electrode stack and a gate stack (such as the gate stack 503) is formed over the source/channel/drain layer as described above with reference to FIGS. 3A-5C. In some embodiments, the source/channel/drain layer comprises one or more 2D material layers (such as the 2D material layer 301) as described above with reference to FIGS. 3A-3C. In some embodiments, a stack of layers comprising one or more 2D material layers, a fourth dielectric layer on one or more 2D material layers, and a third conductive layer on the fourth dielectric layer is formed over the source/drain electrode stack as described above with reference to FIGS. 3A-4C. Subsequently, the stack of layers is patterned to form the source/channel/drain layer and the gate stack as described above with reference to FIGS. 5A-5C.

Finally, during step 1105, conductive plugs (such as the first conductive plug 803, the second conductive plug 805, and the third conductive plug 807) are formed to provide electrical connections to the source/drain electrode stacks and the gate stack as described above with reference to FIGS. 6A-8C. In some embodiments, an interlayer dielectric layer (such as the ILD layer 601) is formed over the source/drain electrode stacks and the gate stack as described above with reference to FIGS. 6A-6C. In some embodiments, openings (such as the first opening 701, the second opening 703, and the third opening 705) are formed to expose first and second source/drain electrodes of the source/drain electrode stack and a gate electrode of the gate stack as described above with reference to FIG. 7A-7C. Subsequently, the openings are filled by suitable conductive materials to form the conductive plugs as described above with reference to FIGS. 8A-8C.

The embodiments of the present disclosure have some advantageous features. For example, by adopting 2D material layers to form channel and source/drain regions, FET devices having undoped source/drain regions can be formed. In addition, source/drain electrode first process describe above allows for FET devices with channel lengths that are below the photolithography limit. Moreover, source/drain regions formed in 2D material layers comprise Schottky barriers with barrier heights that can be tuned according to desired specifications of FET devices. For example, by suitably tuning barrier heights of Schottky barriers, FET devices operating in tunnel regimes, or FET devices having symmetric and/or asymmetric source/drain regions can be formed.

According to an embodiment, a semiconductor device includes a substrate, and a source/drain electrode stack over the substrate, wherein the source/drain electrode stack includes a first source/drain electrode, a second source/drain electrode, and a dielectric layer interposed between the first source/drain electrode and the second source/drain electrode. The semiconductor device further includes a source/channel/drain layer disposed on a first sidewall of the source/drain electrode stack, wherein the source/channel/drain layer includes a 2D material, and a gate stack over the source/channel/drain layer.

According to another embodiment, a semiconductor device includes a first conductive layer over a substrate, the first conductive layer having a first sidewall, a first dielectric layer over the first conductive layer, the first dielectric layer having a second sidewall, and a second conductive layer over the first dielectric layer, the second conductive layer having a third sidewall, wherein the first sidewall and the second sidewall are substantially coplanar with the third sidewall. The semiconductor device further includes a 2D material layer disposed on the first sidewall, the second sidewall, and the third sidewall, a second dielectric layer over the 2D material layer, and a third conductive layer over the second dielectric layer.

According to yet another embodiment, a method of forming a semiconductor device, the method includes forming a source/drain electrode stack over a substrate, wherein the source/drain electrode stack includes a first source/drain electrode, a first dielectric layer over the first source/drain electrode, and a second source/drain electrode over the first dielectric layer. The method further includes forming a source/channel/drain layer on a sidewall of the source/drain electrode stack, wherein the source/channel/drain layer includes a 2D material, and forming a gate stack on the source/channel/drain layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device comprising:
   a substrate;
   a source/drain electrode stack over the substrate, wherein the source/drain electrode stack comprises a first source/drain electrode, a second source/drain electrode, and a dielectric layer interposed between the first source/drain electrode and the second source/drain electrode;
   a source/channel/drain layer disposed on a first sidewall of the source/drain electrode stack, wherein the source/channel/drain layer comprises a 2D material, wherein a top surface of the source/channel/drain layer faces away from the substrate, wherein a portion of the top surface of the source/channel/drain layer extends below a top surface of the first source/drain electrode and away from the first sidewall of the source/drain electrode stack, and wherein the portion of the top surface of the source/channel/drain layer is parallel to a major surface of the substrate; and
   a gate stack over the source/channel/drain layer.

2. The semiconductor device of claim 1, wherein the 2D material is a transition metal dichalcogenide, graphene, or boron nitride.

3. The semiconductor device of claim 1, wherein the source/channel/drain layer is disposed on a second sidewall of the source/drain electrode stack, the second sidewall of the source/drain electrode stack being opposite the first sidewall of the source/drain electrode stack.

4. The semiconductor device of claim 1, wherein a first source/drain region of the source/channel/drain layer is disposed on a sidewall of the first source/drain electrode, and wherein a second source/drain region of the source/channel/drain layer is disposed on a sidewall of the second source/drain electrode.

5. The semiconductor device of claim 4, wherein the first source/drain region comprises a first Schottky barrier, and wherein the second source/drain region comprises a second Schottky barrier.

6. The semiconductor device of claim 1, wherein a width of the first source/drain electrode is larger than a width of the second source/drain electrode.

7. The semiconductor device of claim 1, wherein a channel region of the source/channel/drain layer is disposed on a sidewall of the dielectric layer.

8. The semiconductor device of claim 7, wherein a length of the channel region is substantially equal to a thickness of the dielectric layer.

9. A semiconductor device comprising:
a first conductive layer over a substrate, the first conductive layer having a first sidewall;
a first dielectric layer over the first conductive layer, the first dielectric layer having a second sidewall;
a second conductive layer over the first dielectric layer, the second conductive layer having a third sidewall, wherein the first sidewall and the second sidewall are substantially coplanar with the third sidewall;
a 2D material layer disposed on the first sidewall, the second sidewall, and the third sidewall, a portion of the 2D material layer extending horizontally over the substrate and away from the first sidewall, the portion of the 2D material layer extending below a top surface of the first conductive layer;
a second dielectric layer over the 2D material layer;
a third conductive layer over the second dielectric layer;
a first conductive plug in electrical contact with the first conductive layer;
a second conductive plug in electrical contact with the second conductive layer; and
a third conductive plug in electrical contact with the third conductive layer.

10. The semiconductor device of claim 9, wherein the 2D material layer, the second dielectric layer, and the third conductive layer have a same width.

11. The semiconductor device of claim 9, wherein the first conductive layer, the second conductive layer, and the first dielectric layer have a same width.

12. The semiconductor device of claim 9, wherein the first conductive plug extends through the second conductive layer and the first dielectric layer.

13. The semiconductor device of claim 12, wherein the first conductive plug is electrically isolated from the second conductive layer by a third dielectric layer disposed on sidewalls of the first conductive plug.

14. The semiconductor device of claim 9, wherein the first conductive plug extends through the first dielectric layer.

15. A method of forming a semiconductor device, the method comprising:
forming a first dielectric layer over a substrate;
forming a source/drain electrode stack over the first dielectric layer, wherein the source/drain electrode stack comprises a first source/drain electrode, a second dielectric layer over the first source/drain electrode, and a second source/drain electrode over the second dielectric layer;
forming a source/channel/drain layer on a sidewall of the source/drain electrode stack, wherein the source/channel/drain layer comprises a 2D material, wherein at least a portion of the source/channel/drain layer extends along and contacts a topmost surface of the first dielectric layer, and wherein the topmost surface of the first dielectric layer is a farthest surface of the first dielectric layer from the substrate; and
forming a gate stack on the source/channel/drain layer, wherein at least a portion of the gate stack physically contacts the topmost surface of the first dielectric layer.

16. The method of claim 15, wherein a width of the source/channel/drain layer substantially equals to a width of the gate stack.

17. The method of claim 15, further comprising:
forming an interlayer dielectric layer over the gate stack;
forming a first conductive plug through the interlayer dielectric layer, the second source/drain electrode, and the second dielectric layer, the first conductive plug being in electrical contact with the first source/drain electrode;
forming a second conductive plug through the interlayer dielectric layer, the second conductive plug being in electrical contact with the second source/drain electrode; and
forming a third conductive plug through the interlayer dielectric layer, the third conductive plug being in electrical contact with the gate stack.

18. The method of claim 15, further comprising:
forming an interlayer dielectric layer over the gate stack;
forming a first conductive plug through the interlayer dielectric layer and the second dielectric layer, the first conductive plug being in electrical contact with the first source/drain electrode;
forming a second conductive plug through the interlayer dielectric layer, the second conductive plug being in electrical contact with the second source/drain electrode; and
forming a third conductive plug through the interlayer dielectric layer, the third conductive plug being in electrical contact with the gate stack.

19. The method of claim 18, wherein the first conductive plug is laterally spaced apart from the second source/drain electrode.

20. The semiconductor device of claim 1, wherein the first source/drain electrode comprises a first material and the second source/drain electrode comprises a second material, the first material being different from the second material.

* * * * *